United States Patent
Tanabe et al.

(10) Patent No.: US 8,672,663 B2
(45) Date of Patent: Mar. 18, 2014

(54) IMPRINT APPARATUS AND ARTICLE MANUFACTURING METHOD

(75) Inventors: Masayuki Tanabe, Utsunomiya (JP); Yasuyuki Tamura, Yokohama (JP); Yukio Hanyu, Isehara (JP)

(73) Assignee: Canon Kabushiki Kaisha (JP)

( * ) Notice: Subject to any disclaimer, the term of this patent is extended or adjusted under 35 U.S.C. 154(b) by 135 days.

(21) Appl. No.: 13/367,500

(22) Filed: Feb. 7, 2012

(65) Prior Publication Data

US 2012/0199997 A1    Aug. 9, 2012

(30) Foreign Application Priority Data

Feb. 7, 2011    (JP) .................. 2011-023516

(51) Int. Cl.
*B29B 13/00*    (2006.01)
(52) U.S. Cl.
USPC ........ 425/210; 425/174.4; 425/171; 425/385; 425/397; 264/494; 264/496; 264/82; 264/85; 264/293

(58) Field of Classification Search
USPC ................. 425/174.4, 171, 385, 397, 210; 264/494, 496, 82, 85, 293
See application file for complete search history.

(56) References Cited

U.S. PATENT DOCUMENTS 7,090,716 B2    8/2006    McMackin et al.

FOREIGN PATENT DOCUMENTS

JP    3700001 B2    9/2005

*Primary Examiner* — Joseph S Del Sole
*Assistant Examiner* — Lawrence D Hohenbrink, Jr.
(74) *Attorney, Agent, or Firm* — Rossi, Kimms & McDowell LLP

(57) ABSTRACT

An imprint apparatus of the present invention that molds and cures an imprint material on a substrate using a mold to form a pattern on the substrate. The imprint apparatus includes a supply unit configured to supply a gas into a gap between the imprint material on the substrate and the mold. The supply unit is configured to supply a mixed gas in which a permeable gas, which permeates at least one of the mold, the imprint material and the substrate, and a condensable gas, which is liquefied under a pressure generated by the molding, is mixed with each other.

9 Claims, 1 Drawing Sheet

IMPRINT APPARATUS AND ARTICLE MANUFACTURING METHOD

BACKGROUND OF THE INVENTION

1. Field of the Invention

The present invention relates to an imprint apparatus, and an article manufacturing method.

2. Description of the Related Art

As the demand for microfabrication of semiconductor devices increases, not only a conventional photolithography technology but also a microfabrication technology in which an uncured resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint resin, photocurable resin) to a shot area (imprint area) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

In the imprint apparatus, an atmosphere in the apparatus is typically ambient air. Thus, ambient air may remain in the space between a mold and resin when the mold is pressed against the resin. Because of the entrapped air bubbles (residual gas) in the resin, defects may occur on the pattern to be transferred. Consequently, an accurate pattern may not be formed. In contrast, a method for waiting until residual gas is dissolved into, diffused from, or passed through a resin or a mold to thereby be extinguished may exist, however, a considerable amount of time is required for an imprinting step. Accordingly, U.S. Pat. No. 7,090,716 discloses an imprint apparatus that dissolves or diffuses the remaining a permeable gas into/from a resin or a mold to thereby decrease residual gas quickly by using a permeable gas as an imprint atmosphere. On the other hand, Japanese Patent No. 3700001 discloses an imprint apparatus in which a condensable gas to be condensed by pressure rise upon pressing a mold against a resin is used as an imprint atmosphere. Since the condensable gas is liquefied during remaining, and thus, its volume is reduced by up to a few hundredths of one percent in compared with its volume in the gaseous state, the effects of the residual gas on pattern formation may be suppressed.

However, in the imprint apparatuses disclosed in U.S. Pat. No. 7,090,716 and Japanese Patent No. 3700001, imprint atmosphere is totally purged by a permeable gas or a condensable gas, which is disadvantageous in terms of cost. Also, the imprint apparatus typically measures the position of a wafer stage or the like, which moves as appropriate, accurately using an interference displacement measuring unit. Since the measuring beam (light) is used, the measuring unit is very sensitive to changes in the composition of the medium (atmosphere) passing therethrough or changes in pressure and temperature. Thus, when the periphery of a resin on a substrate is purged by, for example, a gas having refractive index different from that of ambient air, the interference displacement may not accurately be measured if the gas enters the optical path of the measuring unit. Here, a permeable gas has smaller specific gravity than that of ambient air and has smaller refractive index than that of ambient air. Thus, if the permeable gas enters the optical path of the measuring beam, the refractive index of medium becomes small, and thus, interference displacement measurement may become unstable. On the other hand, a condensable gas has greater specific gravity than that of ambient air and has greater refractive index than that of ambient air. Thus, if the condensable gas enters the optical path of the measuring beam, the refractive index of medium becomes great, and thus, interference displacement measurement may also become unstable. If interference displacement measurement becomes unstable, the positioning of a wafer stage or the like becomes unstable. Consequently, the position of a pattern to be transferred deviates from the target position, and thus, accurate pattern formation may not be provided.

SUMMARY OF THE INVENTION

The present invention provides an imprint apparatus that is advantageous in compatibility between accurate pattern formation and throughput.

According to an aspect of the present invention, an imprint apparatus that molds and cures an imprint material on a substrate using a mold to form a pattern on the substrate is provided that includes a supply unit configured to supply a gas into a gap between the imprint material on the substrate and the mold, wherein the supply unit is configured to supply a mixed gas in which a permeable gas, which permeates at least one of the mold, the imprint material, and the substrate, and a condensable gas, which is liquefied under a pressure generated by the molding, is mixed with each other.

According to the present invention, an imprint apparatus that is advantageous in compatibility between accurate pattern formation and throughput may be provided.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

Figure 1:
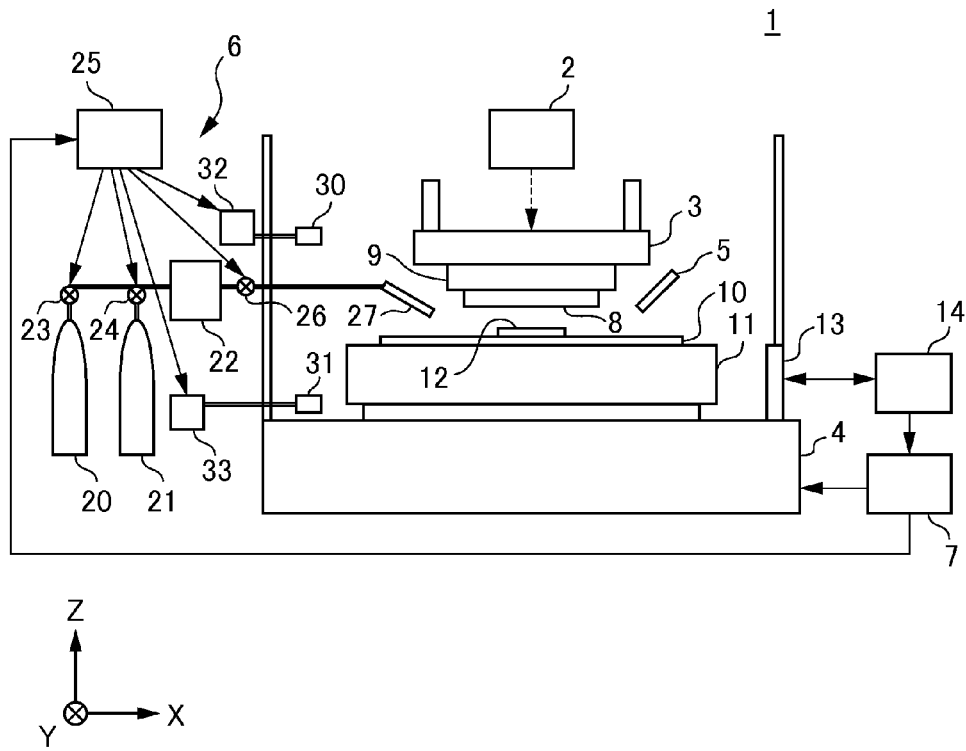
FIG. 1 is a diagram illustrating the configuration of an imprint apparatus according to an embodiment of the present invention.

Firstly, a description will be given of the configuration of an imprint apparatus according to one embodiment of the present invention. FIG. 1 is a diagram illustrating the configuration of an imprint apparatus of the present embodiment. The imprint apparatus is an apparatus that molds an imprint material (typically, uncured resin) on a wafer (on a substrate), i.e., an object to be treated, using a mold to thereby form a pattern (typically, resin pattern) on the substrate, which is used in the manufacture of devices such as semiconductor devices and the like. Here, the imprint apparatus is an apparatus employing a photo-curing method. In the following drawings, a description will be given where the Z axis is aligned parallel to the optical axis of an illumination unit that illuminates ultraviolet light onto a resin on a substrate, and mutually orthogonal axes X and Y are aligned in the direction in a plane perpendicular to the Z axis. An imprint apparatus 1 includes an illumination unit 2, a mold holding unit 3, a wafer stage 4, a dispenser 5, a gas supply unit 6 and a controller 7.

The illumination unit 2 irradiates a mold 8 with ultraviolet light during imprint processing. The illumination unit 2 is constituted by a light source (not shown) and an optical element that adjusts ultraviolet light emitted from the light source to a light suitable for imprinting. The mold 8 is a mold in which a predetermined pattern (e.g., a concave and convex pattern such as a circuit pattern or the like) is three-dimensionally formed on a side facing a wafer 10. The material of the mold 8 is a material such as quartz or the like through which ultraviolet light can pass.

The mold holding unit (holding unit) 3 draws and holds the mold 8 using a vacuum attraction force or an electrostatic force. The mold holding unit 3 includes a mold chuck 9 and a mold drive mechanism (not shown) that drives the mold holding unit 3 in the Z axial direction so as to press the mold 8 against an ultraviolet curable resin applied to the wafer 10. The mold-printing operation and the mold-releasing operation performed by the imprint apparatus 1 may be realized by moving the mold 8 in the Z direction as described above, may be realized by moving the wafer stage 4 (the wafer 10) in the Z direction, or may also be realized by moving both the mold 8 and the wafer stage 4 (the wafer 10) in the Z direction.

The wafer stage 4 is a holding unit including a wafer chuck 11 that holds the wafer 10 by vacuum attraction or the like and is moveable in the XY plane. Here, the wafer 10 is an object to be treated consisting of, for example, a single crystal silicon, and an ultraviolet curable resin (hereinafter referred to simply as "resin"), which is molded by the mold 8, is applied to the treatment surface thereof. Also, the wafer stage 4 includes a plurality of reference mirrors (reflecting parts) 13 on the periphery thereof such that the position of the wafer stage 4 can be controlled with the six degrees of freedom (X, Y, Z, ωx, ωy, and ωz). The imprint apparatus 1 includes a plurality of laser interferometers (measuring units) 14 that measure the position of the wafer stage 4 by irradiating each of these reference mirrors 13 with beam. The laser interferometer 14 measures the position of the wafer stage 4 on a real-time basis. The controller 7 to be described below executes positioning control for the wafer 10 (the wafer stage 4) based on the measured value.

The dispenser 5 applies a resin 12 (uncured resin) to the wafer 10. Here, the resin 12 is a photocurable resin (imprint material) having the property of being cured by receiving irradiation of ultraviolet light, and is appropriately selected depending on the manufacturing process of semiconductor devices or the like.

The gas supply unit (supply unit) 6 supplies a mixed gas towards the mold-pressing position during a mold-pressing operation for pressing the mold 8 against the resin 12 on the wafer 10 to each other. The gas supply unit 6 includes a permeable gas supply unit 20 that first supplies a permeable gas having dissolution and diffusion properties to at least one of the mold 8, the resin 12, and the wafer 10. Also, the gas supply unit 6 includes a condensable gas supply unit 21 that supplies a condensable gas having the property of being condensed and liquefied by applying pressure (pressure rise). Here, as the permeable gas, gas such as helium, hydrogen, or the like may be employed. It should be noted that, if combustible hydrogen is used as the permeable gas, an explosion-proof system needs to be separately provided in the imprint apparatus 1 so as to be ensure protection against fire. On the other hand, as the condensable gas, HFCs (hydrofluorocarbon) typified by HFC-245fa (1, 1, 1, 3, 3-pentafluoropropane, $CHF_2CH_2CF_3$) may be employed. Note that gas to be employed as a condensable gas is not limited thereto, but may also be HFE (hydrofluoroether) typified by HFE-245mc ($CF_3CF_2OCH_3$) or the like. Further, the gas supply unit 6 includes a gas mixing unit 22 that mixes a permeable gas and a condensable gas supplied from the permeable gas supply unit 20 and the condensable gas supply unit 21, respectively, and a gas supply controller 25 that controls the supply amount of gases to be supplied to the gas mixing unit 22 via a first valve 23 and a second valve 24. The gas supply controller 25 is an adjustment device that supplies a mixed gas, which has been generated by mixing gases at a desired component ratio in the gas mixing unit 22, from a gas supply nozzle 27 to the mold-pressing position sandwiched between the mold 8 and the wafer 10 while adjusting the supply amount by controlling a third valve 26. The gas supply controller 25 may be singularly provided in the imprint apparatus 1 so as to be connected to the controller 7 (to be described below) via a line or may be integral with the controller 7.

The controller 7 may control the operation, adjustment, and the like of the components of the imprint apparatus 1. The controller 7 is constituted by a computer or the like and is connected to the components of the imprint apparatus 1 through a line so as to execute control of the components by a program or the like. In the present embodiment, the controller 7 controls the processing operation of at least the laser interferometer 14 and the gas supply controller 25 as well as the operation of the mold holding unit 3, the wafer stage 4, and the like. Note that the controller 7 may be integrated with the rest of the imprint apparatus 1, or may be installed at a location separate from the location where the rest of the imprint apparatus 1 is installed.

Next, imprint processing performed by the imprint apparatus 1 will now be described. First, the controller 7 places and fixes the wafer 10 on the wafer stage 4 using a substrate conveyance device (not shown), and then moves the wafer stage 4 to the application position of the dispenser 5. Then, as an application step, the dispenser 5 applies a resin (uncured resin) 12 to a predetermined shot (imprint area) on the wafer 10. Next, the controller 6 moves the wafer stage 4 such that the shot on the wafer 10 is placed in a position directly below the mold 8. Next, after the mold 8 is aligned with the shot on the wafer 10 and the magnification correction for the mold 8 is carried out using a magnification correction mechanism (not shown), the controller 7 drives the mold drive mechanism so as to press the mold 8 against the resin 12 on the wafer 10 (mold-pressing step). During the mold-pressing step, the resin 12 is filled in the concave portion formed in the mold 8. Under this condition, the illumination unit 2 emits ultraviolet light from the back surface (top surface) of the mold 8, and the resin 12 is cured by the ultraviolet light that has been transmitted through the mold 8 as a curing step. After the resin 12 is cured, the controller 7 again drives the mold drive mechanism to thereby release the mold 8 from the wafer 10 (mold-releasing step). By the aforementioned steps, the three dimensionally shaped layer of the resin 12 following the concave and convex pattern is formed on the shot surface on the wafer 10.

Figure 2:
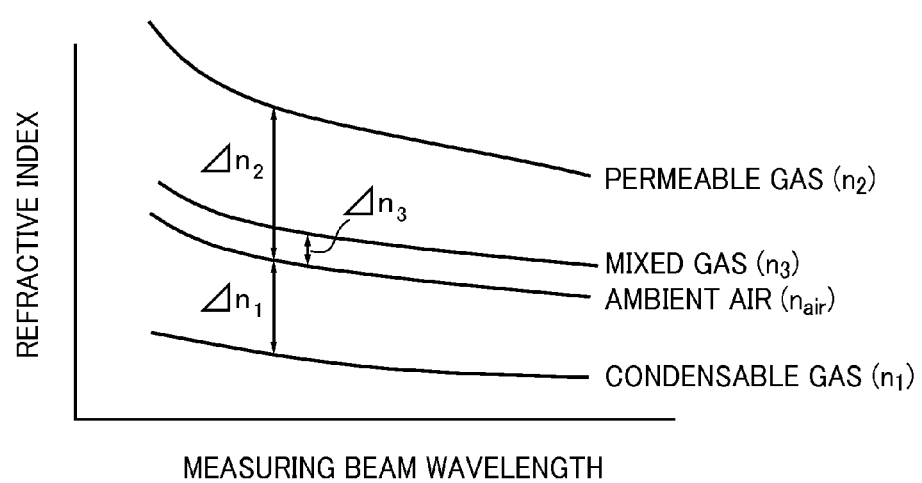
FIG. 2 is a graph illustrating the refractive indices of gases relative to the wavelength of a measuring beam.

In particular, in the mold-pressing step of the present embodiment, the controller 7 causes the gas supply unit 6 to supply a mixed gas of a permeable gas and a condensable gas to the mold-pressing position. FIG. 2 is a graph illustrating the relationship between the refractive index of each atmosphere (ambient air, a permeable gas, a condensable gas, and a mixed gas of the permeable gas and the condensable gas) and the measuring beam wavelength of the laser interferometer 14. Here, a permeable gas is helium gas and a condensable gas is HFC-245fa gas. As described above, a permeable gas typically has a small molecular dimension and has smaller refractive index than that of ambient air, whereas the refractive index of a condensable gas is greater than that of ambient air. Thus, given that the refractive index of ambient air of 1 atm is $n_{air}$, the refractive index of a permeable gas is $n_1$, and the refractive index of a condensable gas is $n_2$, the relationship shown in the following Formula (1) is satisfied:

$$n_1 < n_{air} < n_2 \quad (1)$$

Furthermore, when the refractive index of a mixed gas of a permeable gas and a condensable gas of 1 atm is $n_3$, the difference in refractive index between a permeable gas and ambient air is $\Delta n_1$, the difference in refractive index between a condensable gas and ambient air is $\Delta n_2$, and the difference in refractive index between a mixed gas and ambient air is $\Delta n_3$. Here, if a mixed gas is used, the difference in refractive index between a mixed gas and its surrounding ambient air may become smaller in comparison with the case where only a permeable gas is used as a gas to be supplied to the mold-pressing position, whereby the effects on interference displacement measurement may be suppressed. Such case may be achieved only when the relationship shown in the following Formula (2) is satisfied:

$$|\Delta n_1| > |\Delta n_3| \quad (2)$$

On the other hand, if a mixed gas is used, the difference in refractive index between a mixed gas and its surrounding ambient air may become smaller in comparison with the case where only a condensable gas is used as a gas to be supplied to the mold-pressing position, whereby the effects on interference displacement measurement may be suppressed. Such case may be achieved only when the relationship shown in the following Formula (3) is satisfied:

$$|\Delta n_2| > |\Delta n_3| \quad (3)$$

In Formulae (2) and (3), the difference in refractive index therebetween is the absolute value. Specifically, if a permeable gas and a condensable gas, which satisfy the condition shown in Formula (1), are used, the conditions shown in Formula (2) and Formula (3) are necessarily satisfied. In this case, the effects on interference displacement measurement may be suppressed in comparison with the case of a single use of either a permeable gas or a condensable gas.

Thus, when a mixed gas of a permeable gas and a condensable gas is supplied to the mold-pressing position, two gas recovery nozzles 30 and 31 may be provided in the imprint apparatus 1. As shown in FIG. 1, the optical path of the laser interferometer 14 is at a position lower than that of the top surface of the wafer chuck 11. Here, since HFC-245fa in a mixed gas has a greater specific gravity than that of helium and ambient air, HFC-245fa may be separated from a mixed gas to thereby readily enter an interference displacement measurement region (optical path). Hence, the component ratio of helium may be set to be slightly higher than a ratio at which the refractive index of helium becomes the same as that of ambient air. In this case, the refractive index of a mixed gas to be supplied is smaller than that of ambient air. Also, the imprint apparatus 1 includes a first gas recovery nozzle 30 that is provided at a position higher than the mold-pressing position and a second gas recovery nozzle 31 that is provided at a position lower than the mold-pressing position in the direction of gravity. The gas recovery nozzles 30 and 31 are connected to first and second gas recovery units 32 and 33, respectively. With this arrangement, the gas recovered by the first gas recovery unit 32 has a higher abundance ratio of helium, whereas the gas recovered by the second gas recovery unit 33 has a higher abundance ratio of HFC-245fa. Therefore, helium and HFC-245fa, which have been separated in the imprint apparatus 1, may be efficiently recovered, which is advantageous in terms of recycling gas. When the optical path of the laser interferometer 14 is at a position higher than that of the top surface of the wafer chuck 11, the component ratio of HFC-245fa may be set to be slightly higher than a ratio at which the refractive index of HFC-245fa becomes the same as that of ambient air. In this case, the refractive index of a mixed gas to be supplied is greater than that of ambient air.

Furthermore, the controller 7 may adjust the component ratio of a mixed gas based on the output of the laser interferometer 14 with the wafer stage 4 arranged at the known position. For example, when the measured value during supply of a mixed gas exceeds an allowable range based on the output, the controller 7 instructs the gas supply controller 25 to change the component ratio of a mixed gas. On the other hand, when a detector for detecting the gaseous component of the atmosphere contained in the optical path of the measuring beam is provided in the imprint apparatus 1 and the component value of a condensable gas contained in the detected gaseous component exceeds an allowable range, the controller 7 may cause the gas supply controller 25 to change the component ratio of a mixed gas. In this case, an analyzer unit for analysing a gaseous component may also be provided in association with the detector. Here, the aforementioned allowable range may be determined by taking the apparatus configuration and dimension, the past performance of imprint processing, and the like into consideration. In this manner, even when a condensable gas or the like separated from a mixed gas during supply of the mixed gas enters the optical path of the measuring beam and the output of the laser interferometer 14 is affected thereby, the imprint apparatus can instantly deal with such situation.

As described above, according to the present embodiment, accurate measurement with the laser interferometer 14 may be performed while the amount of gas remaining in the space between the mold 8 and the resin 12 is reduced in a short time. Therefore, an imprint apparatus that is advantageous in accurate pattern formation and throughput compatibility may be provided.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using an imprint apparatus configuring the lithography system described above. Further, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-023516 filed Feb. 7, 2011 which is hereby incorporated by reference herein in its entirety.

What is claimed is:

1. An imprint apparatus that molds and cures an imprint material on a substrate using a mold to form a pattern on the substrate, the imprint apparatus comprising:

a supply unit configured to supply a gas into a gap between the imprint material on the substrate and the mold, wherein the supply unit is configured to supply a mixed gas in which a permeable gas, which permeates at least one of the mold, the imprint material and the substrate, and a condensable gas, which is liquefied under a pressure generated by the molding, is mixed with each other.

2. The apparatus according to claim 1, further comprising:
a holder configured to hold the substrate and to be moveable;
and a measuring device configured to irradiate the holder with light and to measure a position of the holder,
wherein an absolute value of a difference between a refractive index of the mixed gas and a refractive index of ambient air is smaller than an absolute value of a difference between a refractive index of the permeable gas and the refractive index of the ambient air and is smaller than an absolute value of a difference between a refractive index of the condensable gas and the refractive index of the ambient air.

3. The apparatus according to claim 2, further comprising:
an adjustment device configured to adjust a ratio of constituents of the mixed gas; and
a controller configured to cause the adjustment device to adjust the ratio based on an output of the measuring device in a state where the holder is located at a known position.

4. The apparatus according to claim 2, further comprising:
an adjustment device configured to adjust a ratio of constituents of the mixed gas;
a detector configured to detect gaseous constituents or a refractive index of an atmosphere of an optical path of the measuring device; and
a controller configured to cause the adjustment device to adjust the ratio based on an output of the detector.

5. The apparatus according to claim 1, further comprising:
a recovery nozzle configured to recover the mixed gas.

6. The apparatus according to claim 5, wherein the recovery nozzle is located both at a position higher than that of a top surface of the holder and a position lower than that of the top surface.

7. The apparatus according to claim 1, wherein the permeable gas includes at least one of helium and hydrogen.

8. The apparatus according to claim 1, wherein the condensable gas includes at least one of hydrofluorocarbon and hydrofluoroether.

9. A method of manufacturing an article, the method comprising:
forming a pattern on a substrate using an imprint apparatus that molds and cures an imprint material on a substrate using a mold to form a pattern on the substrate, wherein the imprint apparatus includes supply unit configured to supply a gas into a gap between the imprint material on the substrate and the mold, and wherein the supply unit is configured to supply a mixed gas in which a permeable gas, which permeates at least one of the mold, the imprint material and the substrate, and a condensable gas, which is liquefied under a pressure generated by the molding, is mixed with each other; and
processing the substrate, on which the pattern has been formed, to manufacture the article.

* * * * *